United States Patent
Creux et al.

(10) Patent No.: US 7,612,002 B2
(45) Date of Patent: Nov. 3, 2009

(54) GLASS FIBRE FOR THE REINFORCEMENT OF ORGANIC AND/OR INORGANIC MATERIALS, METHOD FOR PRODUCTION OF SAID GLASS FIBRES AND CORRESPONDING COMPOSITION

(75) Inventors: Sophie Creux, Den Haag (NL); Emmanuel Lecomte, Bobigny (FR); Nicolas Renaud, Barberaz (FR)

(73) Assignee: Saint-Gobain Technical Fabrics Europe, Chambery (FR)

( * ) Notice: Subject to any disclaimer, the term of this patent is extended or adjusted under 35 U.S.C. 154(b) by 472 days.

(21) Appl. No.: 10/548,581

(22) PCT Filed: Mar. 10, 2004

(86) PCT No.: PCT/FR2004/000568

§ 371 (c)(1),
(2), (4) Date: Jun. 27, 2006

(87) PCT Pub. No.: WO2004/083142

PCT Pub. Date: Sep. 30, 2004

(65) Prior Publication Data

US 2006/0287185 A1     Dec. 21, 2006

(30) Foreign Application Priority Data

Mar. 13, 2003    (FR) ................... 03 03206

(51) Int. Cl.
*C03C 13/06*    (2006.01)
*C03C 3/093*    (2006.01)

(52) U.S. Cl. .............. 501/36; 501/35; 501/67

(58) Field of Classification Search ............ 501/35, 501/36, 67
See application file for complete search history.

(56) References Cited

U.S. PATENT DOCUMENTS 2,489,242 A * 11/1949 Fletcher et al. ............. 65/462
5,958,808 A * 9/1999 Mori et al. .................. 501/38
6,136,735 A    10/2000 Gallo et al.
6,309,990 B2 * 10/2001 Tamura et al. .............. 501/35
6,846,761 B2 * 1/2005 Tamura ...................... 501/38
2003/0054936 A1 * 3/2003 Tamura ...................... 501/35
2004/0175557 A1    9/2004 Creux et al.

FOREIGN PATENT DOCUMENTS

| EP | 0 498 425 | 8/1992 |
| EP | 1 086 930 | 3/2001 |
| FR | 2 825 084 | 11/2002 |

OTHER PUBLICATIONS

Derwent Abstract 1999-620333, Abstract of EP 1086930A1 and US 6846761. Mar. 28 2001.*
U.S. Appl. No. 10/592,732, filed Sep. 14, 2006, Creux et al.
U.S. Appl. No. 10/592,945, filed Sep. 15, 2006, Creux et al.
U.S. Appl. No. 10/129,265, filed Sep. 30, 2002, Creux et al.

* cited by examiner

*Primary Examiner*—Karl E Group
*Assistant Examiner*—Elizabeth A Bolden
(74) *Attorney, Agent, or Firm*—Oblon, Spivak, McClelland, Maier & Neustadt, L.L.P.

(57) ABSTRACT

Glass reinforcement strand, the composition of which comprises the following constituents, within the limits defined below, expressed as percentages by weight:

| | |
|---|---|
| $SiO_2$ | 50 to 60%, preferably $SiO_2 \geq 52\%$ and/or $SiO_2 \leq 57\%$; |
| $Al_2O_3$ | 10 to 19%, preferably $Al_2O_3 \geq 13\%$ and/or $Al_2O_3 \leq 17\%$; |
| $B_2O_3$ | 16 to 25%; |
| $ZrO_2$ | 0.5 to 1.5%; |
| $Na_2O$ | $\leq 1.5\%$, preferably $Na_2O \leq 0.8\%$; |
| $K_2O$ | $\leq 1.5\%$, preferably $K_2O \leq 0.8\%$; |
| $R_2O$ | $\leq 2\%$, preferably $R_2O \leq 1\%$; |
| CaO | $\leq 10\%$; |
| MgO | $\leq 10\%$; |
| F | 0 to 2%; |
| $TiO_2$ | 0 to 3%; |
| RO | 4 to 15%, preferably $RO \geq 6\%$ and/or $RO \leq 10\%$; and |
| Various | $\leq 3\%$, | where $R_2O = Na_2O + K_2O + Li_2O$, and $RO = CaO + MgO$.

The dielectric properties of such glass compositions are particularly advantageous in the MHz and GHz ranges.

10 Claims, No Drawings

GLASS FIBRE FOR THE REINFORCEMENT OF ORGANIC AND/OR INORGANIC MATERIALS, METHOD FOR PRODUCTION OF SAID GLASS FIBRES AND CORRESPONDING COMPOSITION

The present invention relates to glass strands (or "fibers"), that can be used for reinforcing organic and/or inorganic materials and can be used as textile strands, these strands being able to be obtained by the process which consists in mechanically drawing streams of molten glass flowing out from orifices located at the base of a bushing generally heated by resistance heating.

The present invention is aimed more particularly at glass strands of low dielectric constant having a particularly advantageous novel composition for forming fine strands.

This is because there is a growing demand for glass strands whose permittivity and dielectric losses are low, these being mainly used to form lightweight fabrics, which are used in order to reinforce printed-circuit substrates. The latter consist mainly of a reinforcement, especially glass strands, and a resin, on which substrates various electrical and/or electronic components are placed.

With, on the one hand, the increase in the speed of processing of electrical and/or electronic signals, which involve signals of ever higher frequency, and, on the other hand, the miniaturization of the components which allows their density on a substrate to be increased, the dielectric properties of this substrate become crucial. If these properties do not have the expected performance, there may be a risk of overheating and/or of signal distortion. Moreover, to help in miniaturization, strands of ever smaller diameter are sought in order to reduce the thickness of the components and to improve their planarity.

The polymers conventionally used for printed-circuit boards consist essentially of epoxy resin. Polymers having superior dielectric properties are known at the present time, especially polyimide resins, cyanate ethers, polyesters or even PTFE, the dielectric properties of which are satisfactory.

Any improvement in the dielectric properties of a printed-circuit board must therefore essentially rely on improving the properties of the reinforcement, represented here by the glass strands according to the present invention, which occupy in general about 60% of the volume.

A glass subjected to an AC current converts some of the latter into electrical energy dissipated in the material. This electrical energy is known as dielectric loss. The dielectric losses are proportional to the permittivity and to the loss tangent (tan δ) which depend on the composition of the glass for a given frequency. The dielectric losses are expressed (see for example J. C. Dubois in "Techniques de l'Ingénieur [*Engineering Techniques*]", heading: "Electronique [Electronics]", Chapter E 1850: "Propriétés diélectriques des polymères [*Dielectric properties of polymers*]") by the formula:

$$W = kfv^2 \in \tan \delta$$

where: W is the electrical energy dissipated in the glass or the dielectric loss;

k is a constant;

f is the frequency;

v is the potential gradient;

$\in$ is the permittivity; and tan δ is the dielectric loss tangent or dielectric dissipation factor.

It is usual to denote $\in \tan \delta$ as $\in"$, if tan δ<0.1.

It is clearly apparent from this formula that the more the frequency increases, or the more $\in$ and/or tan δ increase, the greater the dielectric losses become.

In the rest of the text, the term "dielectric properties" refers to the pair ($\in$, $\in"$). To minimize the distortion of a signal, it is desired that both $\in$ and $\in"$ be as low as possible.

It is therefore important to obtain glass compositions that can be fiberized, especially under the conditions of the process already mentioned, in order to form continuous reinforcing strands, having dielectric properties and a diameter that are compatible with the requirements of the latest printed circuits.

More specifically, a tendency to increase the operating frequencies of components, with frequency ranges of the order of GHz (gigahertz), especially 0.9 and 1.8 GHz in the case of telephony, should be noted.

It is therefore very important to study the behavior of glass strands in this frequency range and to optimize their composition so as to limit the dielectric losses, especially for this field of application.

It should be noted that the vast majority of prior studies published in this field relate to dielectric properties of glasses in a frequency range of the order of MHz (megahertz).

The objective of the present invention is to provide novel glass compositions for forming reinforcement strands having dielectric properties of the same order of magnitude as those of the known glasses within the MHz range, which glass compositions have at the same time improved dielectric properties in the GHz range for a smaller strand diameter, while still having satisfactory fiberizing properties in order to obtain reinforcement strands economically.

Furthermore, it is desirable that the glass strands in question can be fiberized under conditions giving rise to the lowest possible amount of breakage.

In the rest of the description, the following are defined:

the dielectric properties there being for the "MHz range", a frequency range in which the characterization of the dielectric properties of the glasses is carried out, especially at 1 MHz and for the "GHz range", a frequency range in which the characterization of the dielectric properties of the glasses is carried out, especially at 9.5 GHz;

the fiberizing properties, which are especially determined by:

the temperature corresponding to a viscosity of $10^3$ poise (decipascal.second or dPa.s), denoted by "T(log η=3)", which gives precious information about the temperature around which the fiberizing is generally carried out, especially from platinum bushings;

the "liquidus temperature", denoted "$T_{liq}$", which corresponds to the temperature at which the growth rate of the most refractory crystal is zero. The liquidus temperature gives the upper limit of the temperature range in which the glass may have a tendency to devitrify.

It is considered possible to fiberize the glass economically if T(log η=3) is less than or equal to 1350° C., and if $T_{liq}$ is more than 100° C., preferably more than 300° C., below T(log η=3). The greater this difference between T(log η=3) and $T_{liq}$, the more likely the fiberizing will be carried out without any incident, and the more the risks of breakage during fiberizing are minimized.

The glass reinforcement strands most commonly used are thus strands formed from glasses which derive from the 1170° C. eutectic of the $SiO_2$—$Al_2O_3$—CaO ternary diagram, particularly the strands referred to as E-glass strands, the archetype of which is described in Patents U.S. Pat. Nos. 2,334,981 and 2,571,074. E-glass strands have a composition essentially based on silica, alumina, lime and boric anhydride. The boric anhydride, present in amounts ranging in practice from 5 to 13% by weight in "E-glass"-type glass compositions, replaces some of the silica. E-glass strands are furthermore characterized by a limited content of alkali metal oxides (essentially $Na_2O$ and/or $K_2O$). Although their fiberizability is good (T(log η=3) of around 1200° C. and $T_{liq}$ of around 1080° C.), their dielectric properties, however, prove to be insufficient as regards the new requirements for printed-circuit substrates.

Another family of glass strands is known and obtained from compositions very rich in silica and boron. The glasses of this family, known by the name "D-glasses" comprise about 75% of $SiO_2$, 20% of $B_2O_3$ and 3% of alkali metals. Although these glasses are attractive for their dielectric properties, also they are very difficult to fiberize (T(log η=3) ≧1400° C). particularly when the strands to be obtained are fine (filament diameter≦10 μm). The yield of this type of strand is low (high degree of breakage) and therefore their production is particularly expensive.

Novel families of compositions have recently been proposed which make it possible to obtain useful dielectric properties and achieve relatively economic fiberizing conditions. These compositions are described for example in applications WO-A-96-A-/39363 and WO 99/52833.

These compositions, although having acceptable dielectric losses in the MHz and GHz ranges, are unsatisfactory for forming fine strands since the degree of breakage during fiberizing remains high.

Another family of compositions already proposed recently is disclosed in FR-A-2 825 084. These compositions are capable of giving reinforcement strands that can be satisfactorily fiberized economically and make it possible to achieve good dielectric properties in the GHz range. It seems that the high performance level is due to the presence of $P_2O_5$ in the compositions.

Although the addition of $P_2O_5$ proves to be beneficial for the dielectric properties, it also increases the risk of demixing and consequently the formation of a hetereogeneous glass which breaks more easily during fiberizing.

It has now been found that the addition of zirconium oxide ($ZrO_2$) into a composition based on the $SiO_2$—$Al_2O_3$—$B_2O_3$ combination makes it possible to obtain strands with a small diameter, especially less than or equal to 10 μm, preferably less than or equal to 7 μm or even around 5 μm under good fiberizing conditions with a reduced breakage rate, while still maintaining acceptable dielectric properties in the MHz and GHz ranges.

Thus the glass strands according to the invention are obtained from a composition essentially comprising the following constituents, within the limits defined below, expressed as percentages by weight:

| | |
|---|---|
| $SiO_2$ | 50 to 60%; |
| $Al_2O_3$ | 10 to 19%; |
| $B_2O_3$ | 16 to 25%; |
| $ZrO_2$ | 0.5 to 1.5%; |
| $Na_2O$ | less than or equal to 1.5%; |
| $K_2O$ | less than or equal to 1.5%; |
| $R_2O$ ($Na_2O + K_2O + Li_2O$) | less than or equal to 2%; |
| CaO | less than or equal to 10%; |
| MgO | less than or equal to 10%; |
| RO (CaO + MgO) | 4 to 15%; |
| F | 0 to 2%; |
| $TiO_2$ | 0 to 3%; and |
| Various | less than or equal to 3%. |

The compositions according to the invention make it possible to obtain satisfactory and advantageous fiberizing properties, allowing economic fiberizing to be carried out, especially because T(log η=3)≦1350° C.

The compositions according to the invention have an acceptable liquidus temperature, especially less than or equal to 1150° C., without major risk of devitrification during fiberizing in the cold regions of the fiberizing crucible and in the feeders conducting the glass from the furnace to the fiberizing crucibles.

Silica is one of the oxides which forms the network of the glass compositions according to the invention and plays an essential role in stabilizing them.

The silica ($SiO_2$) content of the selected compositions is between 50 and 60%, especially greater than 52%, and/or especially less than or equal to 57%.

The alumina $Al_2O_3$ also constitutes a network former of the glasses according to the invention and plays a very important role as regards the hydrolytic resistance of these glasses. Within the context of the limits defined according to the invention, reducing the amount of this oxide to below 10% means that the glass is substantially more susceptible to hydrolytic attack, whereas excessively increasing the amount of this oxide entails the risks of devitrification and an increase in the viscosity.

The $Al_2O_3$ content of the selected compositions is between 10 and 19%, especially greater than or equal to 13%, and/or especially less than or equal to 17%.

The lime (CaO) content of the selected compositions is less than or equal to 10%, especially less than or equal to 8%, or even less than or equal to 6%, and/or preferably greater than or equal to 2%, or even greater than or equal to 4%.

The magnesia (MgO) content of the selected compositions is less than or equal to 10%, especially less than or equal to 8%, or even less than or equal to 6%, and/or preferably greater than or equal to 2%.

The addition of zirconium oxide ($ZrO_2$) appears to be an essential point of the invention. The $ZrO_2$ content is between 0.5 and 1.5%, preferably less than or equal to 1%. This oxide appears to play a very important role in the dielectric properties, more particularly in the GHz range as indicated below in the examples. However, the content must be limited to 1.5% in order to prevent an unacceptable increase in the liquidus temperature.

The defined limits, in terms of alkaline-earth metal oxides, lime and magnesia, make it possible to adjust the viscosity of the glasses according to the invention. Good fiberizability is obtained by choosing the sum of these alkaline-earth metal oxides to be between 4 and 15%, preferably greater than or equal to 6% and/or preferably less than or equal to 10%.

Furthermore, CaO appears to make a beneficial contribution to the hydrolytic resistance.

Alkali metal oxides, especially $Na_2O$ and $K_2O$, may be introduced into the compositions of the glass strands according to the invention in order to limit devitrification and possibly reduce the viscosity of the glass. However, the content of alkali metal oxides ($Na_2O+K_2O+Li_2O$) must remain less than or equal to 2% in order to avoid any deterioration in the dielectric properties and to avoid a detrimental reduction in the hydrolytic resistance of the glass. The alkali metal oxide content is generally greater than 0.1%, due to the presence of impurities contained in the batch materials bearing other constituents and it is preferably less than or equal to 1%, or 0.5% or even 0.3%. The composition may contain a single alkali metal oxide (from $Na_2O$, $K_2O$ and $Li_2O$) or may contain a combination of at least two alkali metal oxides, the content of each alkali metal oxide being less than or equal to 1.5%, preferably less than or equal to 0.8%.

The boron content is between 16 and 25%, preferably greater than or equal to 18% and/or preferably less than or equal to 22%, or even less than or equal to 20%. According to a preferred version of the invention, it is desired to limit this oxide to moderate contents as compared with those of D-glass so as, on the one hand, not to degrade the hydrolytic resistance, and, on the other, since the cost of boron-bearing batch materials is high. Boron may be introduced in a moderate amount by incorporating, as batch material, glass strand scrap comprising boron, for example E-glass strand scrap.

To improve the melting of the glass, fluorine (F) may be added in a small amount, especially from 0.5 to 2%, or it may be present as an impurity, especially from 0.1 to 0.5%.

Titanium oxide ($TiO_2$) may also be introduced in an amount possibly representing up to 3%, preferably less than 2% or even less than 1%, of the composition. It allows the viscocity to be lowered without any appreciable degradation in the dielectric losses.

The possible $Fe_2O_3$ content is rather to be considered as an impurity content, frequently encountered in this family of compositions.

In the rest of the text, any percentage of a constituent of the composition must be understood as a percentage by weight, and the compositions according to the invention may include up to 2 or 3% of compounds to be regarded as unanalyzed impurities (for example SrO, $SO_3$, MnO and $MnO_2$), as is known in this kind of composition.

The invention also relates to composites formed from glass strands and an organic material, in which the reinforcement is provided at least by the glass strands of compositions defined above.

Preferably, such glass strands are used for the manufacture of printed-circuit substrates especially for forming lightweight fabrics composed of strands with a diameter of less than or equal to 10 μm, preferably less than or equal to 7 μm and advantageously around 5 μm.

The subject of the invention is also a process for manufacturing glass strands of compositions defined above, in which a multiplicity of molten glass streams, flowing out of a multiplicity of orifices placed at the base of one or more bushings, is drawn in the form of one or more webs of continuous filaments, and then the filaments are gathered together into one or more strands which are collected on a moving support.

Preferably, the molten glass feeding the orifices of the bushing or bushings has the following composition, expressed as percentages by weight:

| | |
|---|---|
| $SiO_2$ | 50 to 60%, preferably $SiO_2 \geq 52\%$ and/or $SiO_2 \leq 57\%$; |
| $Al_2O_3$ | 10 to 19%, preferably $Al_2O_3 \geq 13\%$ and/or $Al_2O_3 \leq 17\%$; |
| $B_2O_3$ | 16 to 25%; |
| $ZrO_2$ | 0.5 to 1.5%; |
| $Na_2O$ | $\leq 0.8\%$; |
| $K_2O$ | $\leq 0.8\%$; |
| $R_2O$ | $\leq 1\%$; |
| CaO | $\leq 10\%$; |
| MgO | $\leq 10\%$; |
| F | 0 to 2%; |
| $TiO_2$ | 0 to 3%; |
| RO | 4 to 15%, preferably $RO \geq 6\%$ and/or $RO \leq 10\%$; and |
| Various | $\leq 3\%$, |
| where $R_2O = Na_2O + K_2O + Li_2O$, and $RO = CaO + MgO$. | |

It is thus possible to manufacture such glass strands of small diameter under operating conditions similar to those for E-glass and D-glass and thus to obtain, particularly economically, glasses with good dielectric properties.

The invention also relates to glass compositions suitable for producing glass reinforcement strands, comprising the following constituents, within the limits defined below, expressed as percentages by weight:

| | |
|---|---|
| $SiO_2$ | 50 to 60%, preferably $SiO_2 \geq 52\%$ and/or $SiO_2 \leq 57\%$; |
| $Al_2O_3$ | 10 to 19%, preferably $Al_2O_3 \geq 13\%$ and/or $Al_2O_3 \leq 17\%$; |
| $B_2O_3$ | 16 to 25%; |
| $ZrO_2$ | 0.5 to 1.5%; |
| $Na_2O$ | $\leq 1.5\%$, preferably $Na_2O \leq 0.8\%$; |
| $K_2O$ | $\leq 1.5\%$, preferably $K_2O \leq 0.8\%$; |
| $R_2O$ | $\leq 2\%$, preferably $R_2O \leq 1\%$; |
| CaO | $\leq 10\%$; |
| MgO | $\leq 10\%$; |
| F | 0 to 2%; |
| $TiO_2$ | 0 to 3%; |
| RO | 4 to 15%, preferably $RO \geq 6\%$ and/or $RO \leq 10\%$; and |
| Various | $\leq 3\%$, |
| where $R_2O = Na_2O + K_2O + Li_2O$, and $RO = CaO + MgO$. | |

The advantages afforded by the glass strands according to the invention will be more fully appreciated through the following examples, denoted Ex. 1 and Ex. 2, given in Table 1, illustrating the present invention without however limiting it.

Comparative examples, denoted A and B, are also given in Table 1 and correspond to the following glasses:

A: D-glass

B: glass according to patent application Wo 99/52833.

In these examples, strands composed of 7 μm diameter glass filaments (examples 1, 2 and B) and 10 μm glass filaments (example A) were obtained by drawing molten glass; the glass had the composition indicated in Table 1, expressed in percentages by weight.

When the total sum of the contents of all of the compounds is slightly less than or greater than 100%, it should be understood that the residual content corresponds to the impurities and to minor components not analyzed (with contents of at most 1 to 2%) and/or is due to the accepted approximation in this field in the analytical methods used.

$T(\log \eta=3)$ denotes the temperature at which the viscosity of the glass is $10^3$ poise (decipascal·second or dPa·s).

$T_{liq}$ denotes the liquidus temperature of the glass, corresponding to the temperature at which the most refractory phase, which may devitrify in the glass, has a zero growth rate and thus corresponds to the melting point of this devitrified phase.

The differences in the dielectric properties ($\Delta \in$, $\Delta \in''$) measured both at 1 MHz and at 9.5 GHz are indicated, compared with the control A (D-glass).

The measurements at 1 MHz were carried out in a conventional manner, known to a person skilled in the art for this type of metrology.

The measurements at 9.5 GHz were carried out according to the method described by W. B. Westphal ("Distributed Circuits", in "Dielectric materials and applications", the Technology Press of MIT and John Wiley & Sons, Inc. New York, Chapman & Hall, Ltd., London, 1954; see especially page 69). The principle of this method is based on measuring the dielectric properties of a disk-shaped specimen placed against a waveguide. This method allows accurate results to be obtained at very high frequency. In Table 1 is also shown the number of complete bobbins of strand that are formed per day under the conditions mentioned above. This number provides a measure of assessing the comparable fiberizing yield for the various glasses.

It is apparent that the examples according to the invention represent a remarkable compromise between the fiberizing conditions (breakage rate, fiberizing temperature T(log η=3) and $T_{liq}$) and the dielectric properties.

The fiberizing range is satisfactory, especially with a difference between T(log η=3) and $T_{liq}$ of greater than or equal to 180° C.

The dielectric properties of the compositions according to the invention are of the same order of magnitude as those of the compositions according to WO 99/52833 for measurements at 1 MHz and at 9.5 GHz.

Thus, dielectric properties remarkably close to those of D-glass are obtained, while lowering the fiberizing temperature of the glasses according to the invention, compared with that of D-glass.

The glasses according to the invention are also noteworthy in that they allow small-diameter strands to be formed with a particularly advantageous yield. Thus, the number of complete bobbins of strand is greater with the glasses according to the invention than with the glasses according to WO 99/52833 (by 36%) for an identical filament diameter, and considerably higher (by 300%) than with D-glass, and to be so for a much smaller diameter (7 μm instead of 10 μm).

Advantageously, the glass strands according to the invention are suitable for all the usual applications of conventional E-glass strands and can replace D-glass strands in some applications. In particular, the glass strands according to the invention have the advantage of being able to be obtained with a better yield and a lower cost than the known glass strands.

Thanks to their fineness and therefore their low linear density, the glass strands according to the invention are useful for forming lightweight fabrics exhibiting good planarity, particularly desirable in electronic applications.

TABLE 1

|  | Example 1 | Example 2 | A | B |
|---|---|---|---|---|
| $SiO_2$ | 55.7 | 54.7 | 75.3 | 54.7 |
| $Al_2O_3$ | 15 | 15.0 | 0.7 | 15.0 |
| $B_2O_3$ | 19.4 | 19.0 | 19.6 | 19.9 |
| $Na_2O$ |  |  | 1.8 |  |
| $K_2O$ |  |  | 1.2 |  |
| $R_2O$ | 0.3 | 0.3 | 3.0 | 0.3 |
| CaO | 4.1 | 4.0 | 0.8 | 4.0 |
| MgO | 4.1 | 4.0 | 0.4 | 4.0 |
| $TiO_2$ |  | 1.6 |  | 2.5 |
| $ZrO_2$ | 0.9 | 0.9 |  |  |
| F | 0.5 | 0.5 |  | 0.5 |
| T (log η = 3) (° C.) | 1343 | 1330 | 1410 | 1310 |
| $T_{liq}$ (° C.) | 1150 | 1150 | <900 | 1060 |
| Δε at 1 MHz | +0.4 | +0.4 | — | +0.6 |
| Δε" at 1 MHz (×10⁴) | 0 | 0 | — | 0 |
| Δε at 9.5 GHz | +0.5 | +0.6 | — | +0.6 |
| Δε" at 9.5 GHz (×10⁴) | +150 | +160 | — | +120 |
| Number of complete bobbins | 30 | 30 | 10 | 22 |

The invention claimed is:

1. A glass reinforcement strand, comprising glass having the following composition in percentages by weight:

| $SiO_2$ | 50 to 60%; |
|---|---|
| $Al_2O_3$ | 10 to 19%; |
| $B_2O_3$ | 16 to 25%; |
| $ZrO_2$ | 0.5 to 1.5%; |
| $Na_2O$ | ≦1.5%; |
| $K_2O$ | ≦1.5%; |
| $R_2O$ | ≦2% |
| CaO | ≦10%; |
| MgO | ≦10%; |
| F | 0 to 2%; |
| $TiO_2$ | 0 to 3%; |
| RO | 4 to 15%; and |
| Various | ≦3%, | where $R_2O = Na_2O + K_2O + Li_2O$ and $RO = CaO + MgO$.

2. The glass reinforcement strand as claimed in claim 1, wherein the composition comprises $ZrO_2$ in an amount such that $ZrO_2 \leq 1\%$.

3. The glass reinforcement strand as claimed in claim 1, wherein the composition has comprises lime (CaO) in an amount such that CaO≦8%.

4. The glass reinforcement strand as claimed in claim 1, wherein the composition comprises magnesia (MgO) in an amount such that MgO≦8%.

5. The glass reinforcement strand as claimed in claim 1, wherein the composition comprises boron ($B_2O_3$) in an amount such that $B_2O_3 \leq 18\%$.

6. A composite, comprising:
    at least one glass reinforcement strand as claimed in claim 1; and
    organic materials, inorganic materials, or a combination thereof.

7. A printed-circuit substrate comprising at least one glass reinforcement strand as claimed in claim 1.

8. A process for manufacturing the glass reinforcement strand of claim 1, comprising:
    drawing, from a multiplicity of molten glass streams, flowing out of a multiplicity of orifices located at the base of one or more bushings, at least one web of continuous filaments;
    gathering the continuous filaments into at least one strand; and
    collecting the at least one strand on a moving support to form the glass reinforcement strand.

9. The process as claimed in claim 8, wherein the molten glass feeding the orifices of the one or more bushings comprises the following composition, expressed as percentages by weight:

| $SiO_2$ | 50 to 60%; |
|---|---|
| $Al_2O_3$ | 10 to 19%; |
| $B_2O_3$ | 16 to 25%; |
| $ZrO_2$ | 0.5 to 1.5%; |
| $Na_2O$ | ≦1.5%; |
| $K_2O$ | ≦1.5% |
| $R_2O$ | ≦2%; |
| CaO | ≦10%; |
| MgO | ≦10%; |
| F | 0 to 2%; |
| $TiO_2$ | 0 to 3%; |
| RO | 4 to 15%; and |
| Various | ≦3%, | where $R_2O = Na_2O + K_2O + Li_2O$, and $RO = CaO + MgO$.

10. A glass composition suitable for producing glass reinforcement strands, comprising the following constituents, within the limits defined below, expressed as percentages by weight:

| $SiO_2$ | 50 to 60%; |
|---|---|
| $Al_2O_3$ | 10 to 19%; |

-continued

| | |
|---|---|
| $B_2O_3$ | 16 to 25%; |
| $ZrO_2$ | 0.5 to 1.5%; |
| $Na_2O$ | ≦1.5%; |
| $K_2O$ | ≦1.5%; |
| $R_2O$ | ≦2%; |
| CaO | ≦10%; |
| MgO | ≦10%; |
| F | 0 to 2%; |

-continued

| | |
|---|---|
| $TiO_2$ | 0 to 3%; |
| RO | 4 to 15%; and |
| Various | ≦3%, |
| where $R_2O = Na_2O + K_2O + Li_2O$ and $RO = CaG + MgO.$ | |

\* \* \* \* \*